United States Patent
Jeong et al.

(10) Patent No.: US 11,101,365 B2
(45) Date of Patent: Aug. 24, 2021

(54) METHOD FOR FABRICATING SEMICONDUCTOR DEVICE AND SEMICONDUCTOR DEVICE FABRICATED BY THE SAME

(71) Applicant: Samsung Electronics Co., Ltd., Suwon-si (KR)

(72) Inventors: Young Cheon Jeong, Suwon-si (KR); YongKuk Jeong, Suwon-si (KR); Jin Hyuk Jeong, Suwon-si (KR); Tae Gyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/684,146

(22) Filed: Nov. 14, 2019

(65) Prior Publication Data
US 2020/0251573 A1    Aug. 6, 2020

Related U.S. Application Data

(60) Provisional application No. 62/799,429, filed on Jan. 31, 2019.

(30) Foreign Application Priority Data
Mar. 26, 2019    (KR) .................. 10-2019-0034120

(51) Int. Cl.
*H01L 29/66* (2006.01)
*H01L 21/3065* (2006.01)
(Continued)

(52) U.S. Cl.
CPC .. *H01L 29/66545* (2013.01); *H01L 21/02164* (2013.01); *H01L 21/02236* (2013.01);
(Continued)

(58) Field of Classification Search
CPC ......... H01L 29/66545; H01L 21/02164; H01L 21/02236; H01L 21/3065; H01L 21/31111; H01L 29/401
See application file for complete search history.

(56) References Cited

U.S. PATENT DOCUMENTS 6,602,720 B2 *   8/2003   Hsu .................. H01L 21/02189
                                                              438/3
8,642,473 B2    2/2014   Chang et al.
(Continued)

FOREIGN PATENT DOCUMENTS

KR    10-2011-0136956 A    12/2011
KR    10-1134437 B1    4/2012

OTHER PUBLICATIONS

Stoffel et al., "Strain selectivity of SiGe wet chemical etchants," Semiconductor Science and Technology, vol. 23, No. 8, Jul. 16, 2008.
(Continued)

*Primary Examiner* — Zandra V Smith
*Assistant Examiner* — Andre C Stevenson
(74) *Attorney, Agent, or Firm* — Muir Patent Law, PLLC

(57) ABSTRACT

Example methods for fabricating a semiconductor device and example semiconductor devices are disclosed. An example method may include forming a sacrificial gate structure on a substrate, and the sacrificial gate structure may include a first portion and a second portion. The method may further include, removing the first portion of the sacrificial gate structure and forming an oxide film by oxidizing an upper surface of the second portion of the sacrificial gate structure after removing the first portion of the sacrificial gate structure. The method may additionally include, forming a trench on the substrate by removing the oxide film and
(Continued)

the second portion of the sacrificial gate structure; and forming a gate electrode that fills the trench.

14 Claims, 21 Drawing Sheets

(51) Int. Cl.
    *H01L 29/40*     (2006.01)
    *H01L 21/02*     (2006.01)
    *H01L 21/311*     (2006.01)

(52) U.S. Cl.
    CPC .... *H01L 21/3065* (2013.01); *H01L 21/31111* (2013.01); *H01L 29/401* (2013.01)

(56) References Cited

U.S. PATENT DOCUMENTS

| | | |
|---|---|---|
| 8,809,178 B2 | 8/2014 | Liu et al. |
| 9,082,789 B2 * | 7/2015 | Huang .................. H01L 29/165 |
| 9,276,087 B2 | 3/2016 | Kim et al. |
| 10,008,497 B2 | 6/2018 | Lee et al. |
| 10,037,912 B2 | 7/2018 | Hsiao et al. |
| 2015/0364595 A1 * | 12/2015 | Liu ....................... H01L 21/845 |
| | | 257/401 |
| 2017/0179290 A1 | 6/2017 | Lo et al. |
| 2019/0378906 A1 * | 12/2019 | Loubet .................. B82Y 10/00 |

OTHER PUBLICATIONS

Schnakenberg et al., "NH4OH for Silicon Micromachining," Technical Digest Micromechanics Europe 1990, 2nd Workshop on Micromachining, Micromechanics and Microsystems, Berlin, Germany, Nov. 26-27, 1990.

* cited by examiner

METHOD FOR FABRICATING SEMICONDUCTOR DEVICE AND SEMICONDUCTOR DEVICE FABRICATED BY THE SAME

This application claims priority from U.S. Provisional Application No. 62/799,429 filed on Jan. 31, 2019 in the USPTO and from Korean Patent Application No. 10-2019-0034120 filed on Mar. 26, 2019 in the Korean Intellectual Property Office, the disclosure of each is incorporated by reference herein in its entirety.

BACKGROUND

1. Technical Field

The present inventive concept relates to a semiconductor device and a method for fabricating a semiconductor device.

2. Description of the Related Art

In recent years, metal gates are often used instead of polysilicon gates to improve characteristics of semiconductor devices. The metal gates may be fabricated, e.g., by using a replacement metal gate process.

In recent years, in order to increase the density of semiconductor devices, the size and/or scale of semiconductor devices have gradually decreased. In semiconductor devices with a reduced scale an alternative metal gate process may require several etching, deposition, and polishing steps.

SUMMARY

Aspects of the present inventive concept provide a method for fabricating a semiconductor device and a semiconductor device fabricated using the same method for improving the reliability of the alternative gate electrode forming process.

However, aspects of the present inventive concept shall not be restricted to the specific embodiments and examples set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a method for fabricating a semiconductor device. The method may include forming a sacrificial gate structure on a substrate, and the sacrificial gate structure may include a first portion and a second portion. The method may further include, removing the first portion of the sacrificial gate structure and forming an oxide film by oxidizing an upper surface of the second portion of the sacrificial gate structure after removing the first portion of the sacrificial gate structure. The method may additionally include, forming a trench on the substrate by removing the oxide film and the second portion of the sacrificial gate structure; and forming a gate electrode that fills the trench.

According to an aspect of the present inventive concept, there is provided a method for fabricating a semiconductor device. The method may include, forming a sacrificial gate structure on a substrate and forming a trench on the substrate by removing the sacrificial gate structure through a sacrificial gate removal process. The method may further include forming a gate electrode that fills the trench. The sacrificial gate removal process may. include a dry etching process, an oxidation process, and a wet etching process that are sequentially performed.

According to an aspect of the present inventive concept, there is provided a method for fabricating a semiconductor device. The method may include forming a sacrificial gate structure on a substrate, the sacrificial gate structure includes a first portion and a second portion. The method may further include, forming gate spacers on both sides of the sacrificial gate structure and forming an etching mask pattern for exposing an upper surface of the sacrificial gate structure and an upper surface of the gate spacer. The method may additionally include removing the first portion of the sacrificial gate structure by a first etching process that utilizes the etching mask pattern and removing the etching mask pattern by a stripping process. The method may additionally include, forming an oxide film by oxidizing an upper surface of the second portion of the sacrificial gate structure by utilizing an oxidation process and forming a trench by removing the oxide film and the second portion of the sacrificial gate structure by a second etching process. The method may additionally include forming an alternative gate electrode that fills the trench.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a method for fabricating a semiconductor device according to some embodiments of the present inventive concept will be described with reference to FIGS. 1 through 13.

FIGS. 1 to 13 are intermediate stage diagrams illustrating a method for fabricating a semiconductor device according to some embodiments of the present inventive concept. In FIGS. 1 to 13, an element isolation film such as a STI (shallow trench isolation) formed in a substrate will not be illustrated for ease of understanding and convenience of description.

Figure 1:
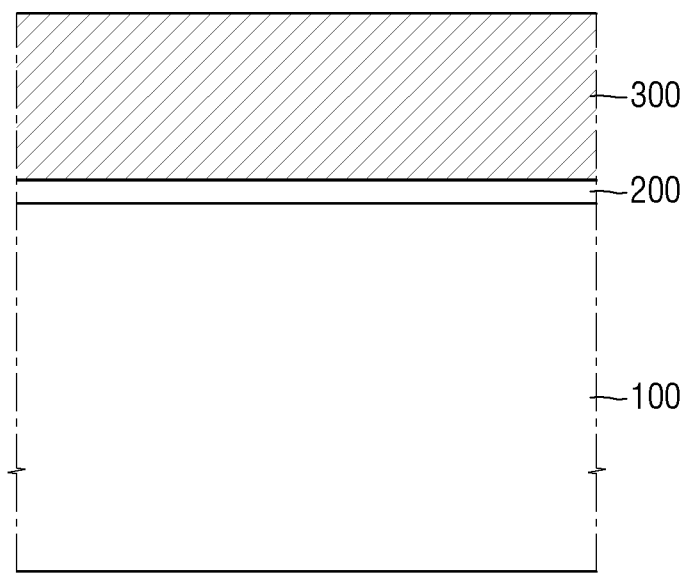
FIGS. 1 to 13 are intermediate stage diagrams illustrating a method for fabricating a semiconductor device according to some embodiments of the present inventive concept.

Referring to FIG. 1, a sacrificial dielectric layer 200 and a sacrificial gate layer 300 are formed on a substrate 100. The sacrificial dielectric layer 200 may be disposed between the substrate 100 and the sacrificial gate layer 300.

The substrate 100 may be bulk silicon or silicon-on-insulator (SOI). In other embodiments, the substrate 100 may be a silicon substrate that may include (but is not limited to) other materials, for example: germanium, silicon germanium, indium antimonide, lead tellurium compound, indium arsenide, indium phosphide, gallium arsenide and/or gallium antimonide.

In addition, the substrate 100 may be a fin type active pattern having a fin shape. The fin type active pattern may include, for example, silicon or germanium which is an elemental semiconductor material.

Alternatively, the fin type active pattern may include a compound semiconductor, for example, a group IV-IV compound semiconductor or a group III-V compound semiconductor. The group IV-IV compound semiconductor may be, for example, a binary compound or a ternary compound containing at least two or more of: carbon (C), silicon (Si), germanium (Ge) and tin (Sn). Alternatively, the group IV-IV compound semiconductor may include a compound in which one of the preceding elements is doped with a group IV element. The group III-V compound semiconductor may be, for example, one of: a binary compound, a ternary compound, or a quaternary compound formed by combination of at least one of: aluminum (Al), gallium (Ga), and indium (In) as a group III element with one of: phosphorus (P), arsenic (As), and antimony (Sb) as a group V element.

The sacrificial dielectric layer 200 may include and/or be, for example, one of: a silicon oxide film ($SiO_2$), a silicon oxynitride film (SiON), and a combination thereof. The sacrificial dielectric layer 200 may be formed using, for example, a heat treatment, a chemical treatment, an atomic layer deposition (ALD) or a chemical vapor deposition (CVD).

The sacrificial gate layer 300 may include and/or be, for example, silicon. Other example embodiments of sacrificial gate layer 300 may include and/or be polycrystalline silicon (poly Si), amorphous silicon (a-Si), and combinations thereof. The sacrificial gate layer 300 may not be doped with impurities or it may be doped with similar impurities.

Although not illustrated, a capping film may be further formed on the sacrificial gate layer 300.

Figure 2:
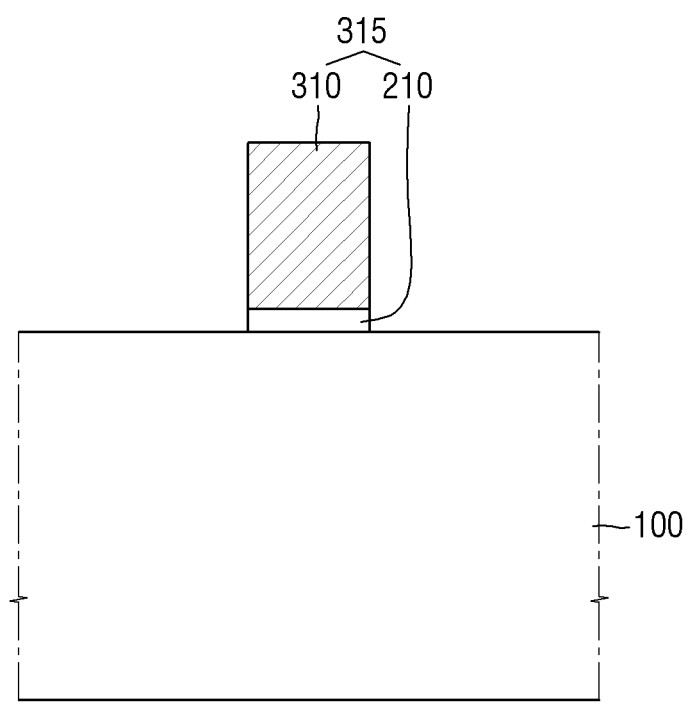

Referring to FIG. 2, the sacrificial gate layer 300 (FIG. 1) and the sacrificial dielectric layer 200 (FIG. 1) are patterned to form a sacrificial gate structure 315 on the substrate 100. The sacrificial gate structure 315 may include a sacrificial dielectric film pattern 210 and a sacrificial gate electrode 310.

The patterning process may include, for example, one of: a dry etching process, a wet etching process, and a combination thereof.

Although not illustrated, the sacrificial gate structure 315 may further include a capping pattern disposed on the sacrificial gate electrode 310.

Figure 3:
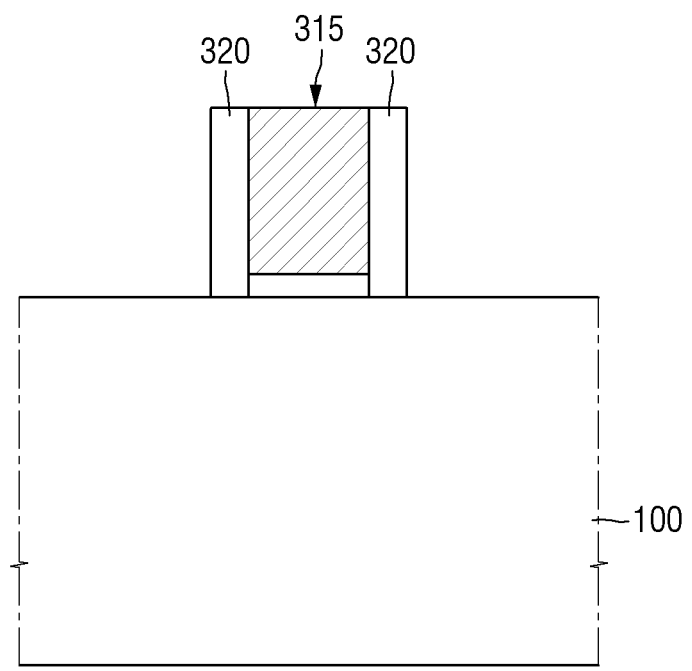

Referring to FIG. 3, gate spacers 320 are formed on the substrate 100. The gate spacers 320 may be formed on both sides of the sacrificial gate structure 315.

The gate spacer 320 may include and/or be, for example, at least one of: silicon nitride (SiN), silicon oxynitride (SiON), silicon oxide ($SiO_2$), silicon oxycarbonitride (SiOCN), and any combination thereof.

Figure 4:
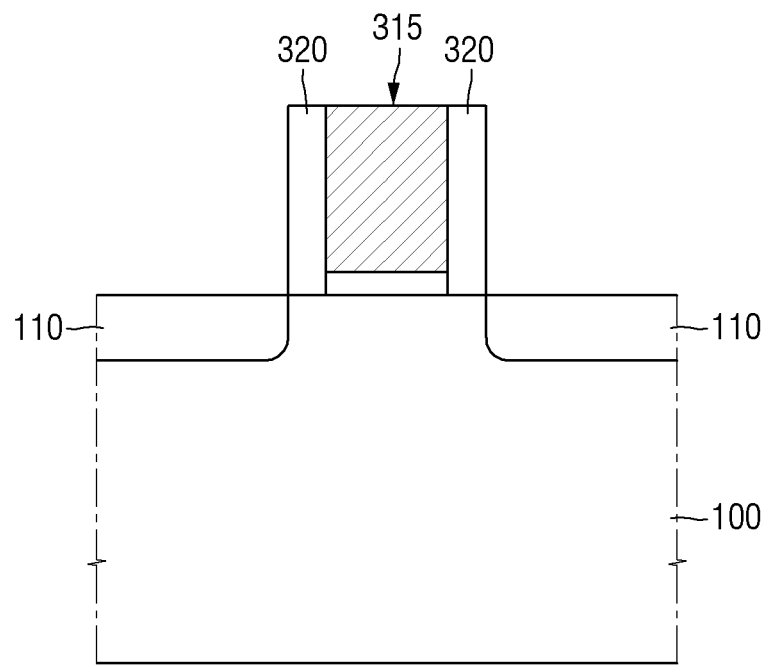

Referring to FIG. 4, a source/drain region 110 is formed in the substrate 100. The source/drain region 110 may be formed to be adjacent to the sacrificial gate structure 315.

Although the source/drain region 110 is illustrated as an impurity region formed in the substrate 100, the present inventive concept is not limited thereto. For example, the source/drain region 110 may include an epitaxial layer formed on the substrate.

Figure 5:
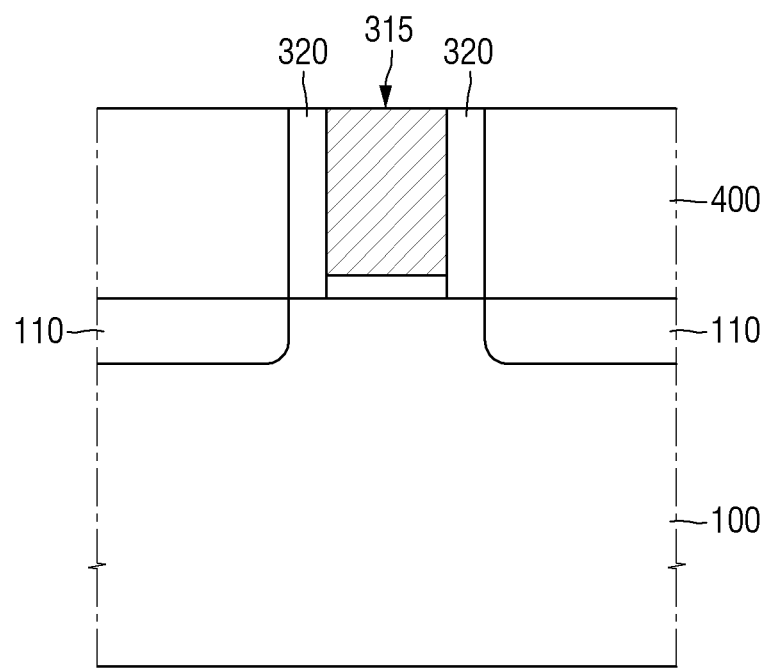

Referring to FIG. 5, an interlayer insulating film 400 is formed on the substrate 100. The interlayer insulating film 400 may wrap around (circumscribe/surround) the sidewalls of the gate spacers 320 and the sacrificial gate structure 315.

In the example embodiment of FIG. 5, the interlayer insulating film 400 does not cover the upper surface of the sacrificial gate structure 315. The upper surface of the sacrificial gate structure 315 is exposed.

The interlayer insulating film 400 may include and/or be, for example, at least one of: a low dielectric constant material, an oxide film, a nitride film, and an oxynitride film. A low dielectric constant material may be made up of, for example, (but is not limited to) FOX (Flowable Oxide), TOSZ (Tonen SilaZen), USG (Undoped Silica Glass), BSG (Borosilica Glass), PSG (PhosphoSilaca Glass), BPSG (BoroPhosphoSilica Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), and any combination thereof.

Figure 6:
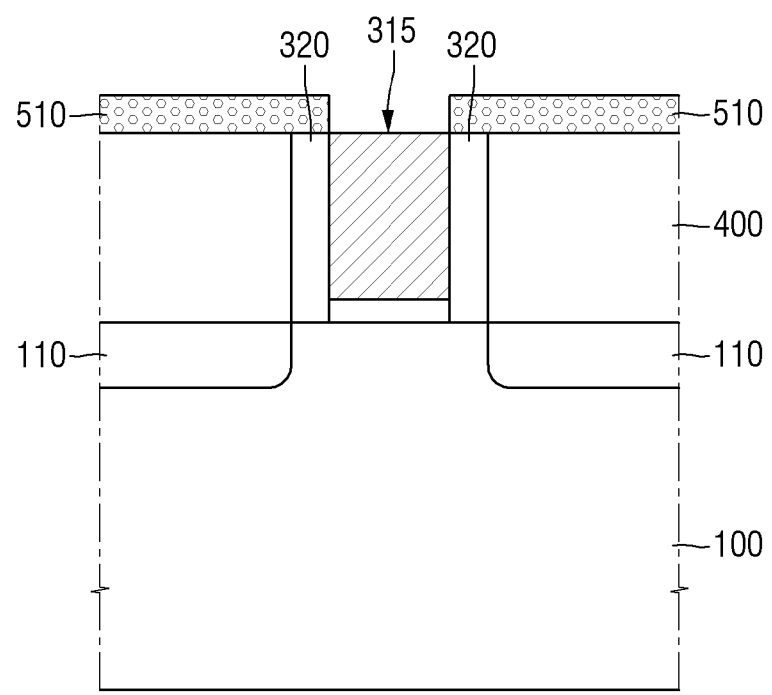

Referring to FIG. 6, a mask pattern 510 is formed on the interlayer insulating film 400 and the gate spacer 320. The mask pattern 510 may leave the sacrificial gate structure 315 exposed, i.e., it may not be formed on top of the sacrificial gate structure 315 or at least a portion thereof.

Figure 7:
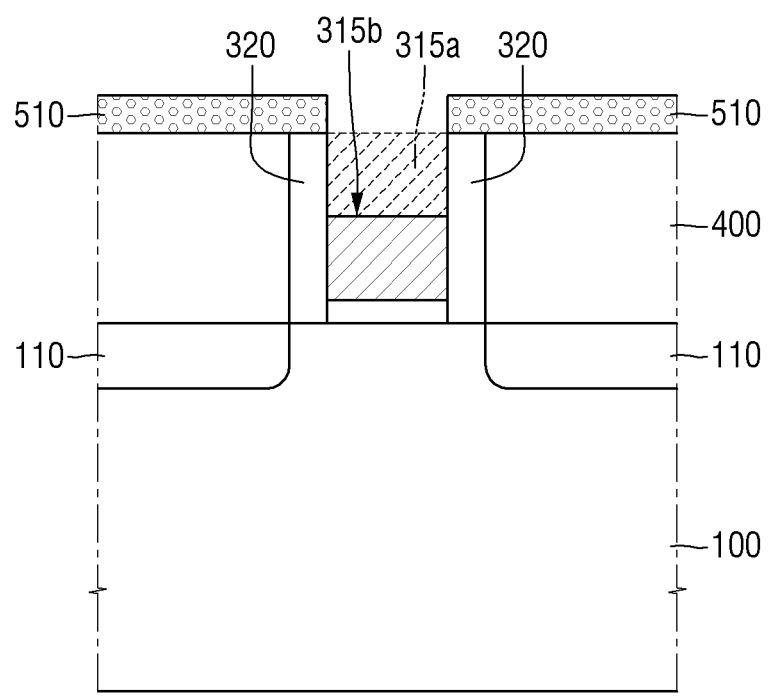

Referring to FIG. 7, a first portion 315a of the sacrificial gate structure 315 is removed. The first portion 315a may be, for example, an upper portion of the sacrificial gate structure 315. In the exemplary embodiment of FIG. 7, the first portion 315a is about half of the sacrificial gate electrode 310 (see FIG. 2). Additionally, in other embodiments the first portion 315a may be within a range of about 10% to 90% of the sacrificial gate electrode 310. However, embodiments in accordance with the inventive concept herein encompass other relative ranges. The second portion 315b of the sacrificial gate structure 315 may remain on top of the substrate 100. The second portion 315b may be understood as a portion of sacrificial gate electrode 310 that remains after first portion 315a is removed. For example, the first portion 315a and the second portion 315b may add up to the total of sacrificial gate electrode 310 and sacrificial dielectric film pattern 210.

Removal of the first portion 315a of the sacrificial gate structure 315 may be understood as the removal of a top portion (or first portion) of the sacrificial gate electrode 310.

The second portion 315b of the sacrificial gate structure 315 may include a second portion (lower portion) of the sacrificial gate electrode 310 and the sacrificial dielectric film pattern 210.

The first portion 315a of the sacrificial gate structure 315 may be removed by a dry etching process. For example, the mask pattern 510 may be used as a mask for a dry etching process to remove the first portion 315a of the sacrificial gate structure 315.

Figure 8:
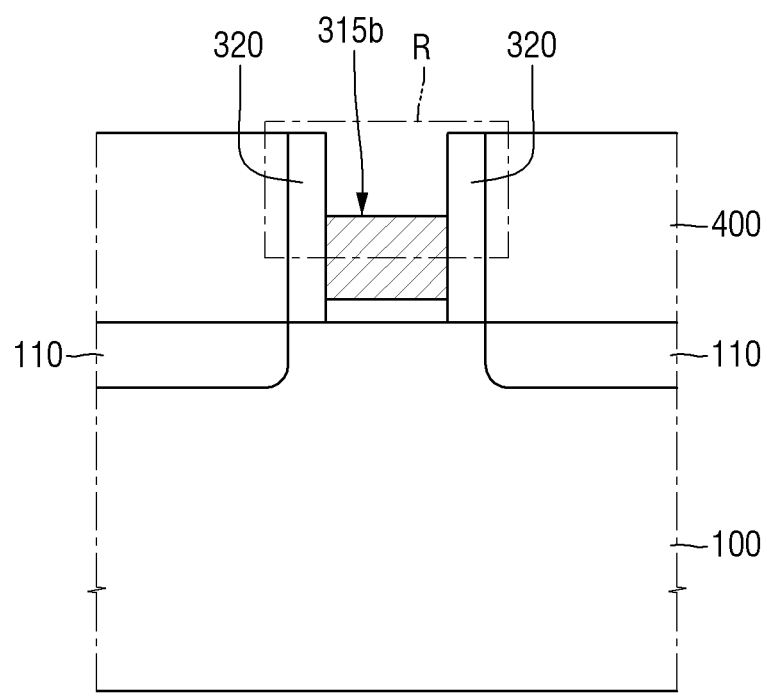

Referring to FIG. 8, the mask pattern 510 (see FIG. 7) is removed from on top of the gate spacer 320 and the interlayer insulating film 400. The mask pattern 510 may be removed by a stripping process.

In some embodiments, when first portion 315a is removed there may be remains or other byproducts, e.g., a fume component. The remains of the first portion 315a of the sacrificial gate structure 315 may be removed by a stripping process. However, the remains of the first portion 315a of the sacrificial gate structure 315 may not be entirely removed by the stripping process. Some of the remains of the first portion 315a of the sacrificial gate structure 315 may remain on the upper surface of the second portion 315b of the sacrificial gate structure 315 after the stripping process.

Figure 9:
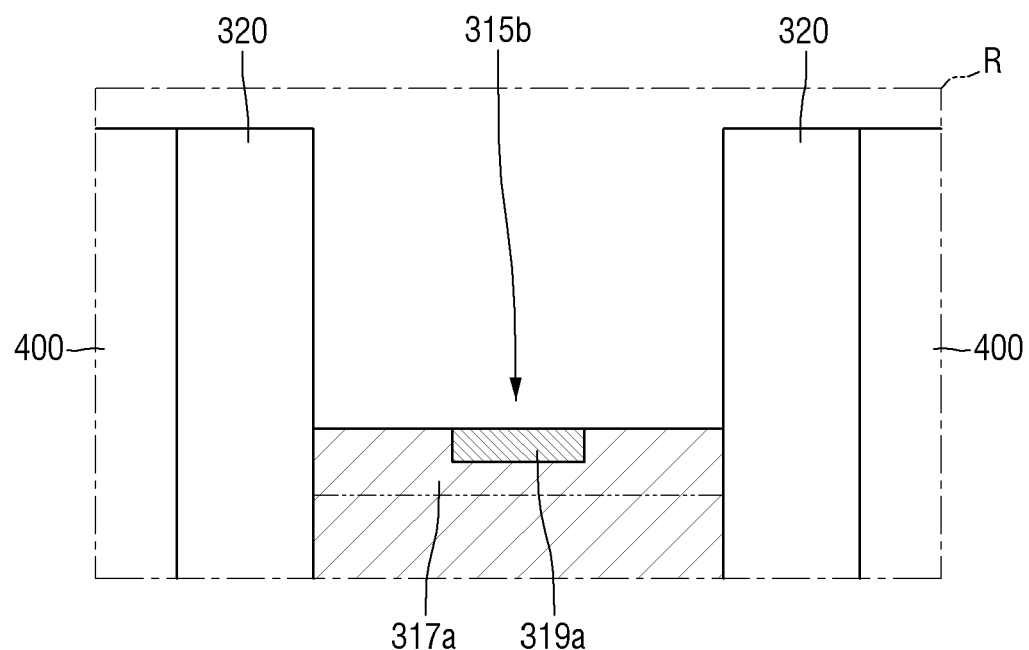

For reference, FIG. 9 is an enlarged view of a region R illustrated in FIG. 8. Referring to FIG. 9, a byproduct region 319a may be formed on the upper surface 317a of the second portion 315b of the sacrificial gate structure 315.

The byproduct region 319a may be formed by the remains of the first portion 315a of the sacrificial gate structure 315. For example, the byproduct region 319a may be formed by a reaction between the remains of the first portion 315a of the sacrificial gate structure 315 and the chemical solution used in the stripping process.

The byproduct region 319a may include silicon II fluoride ($SiF_2$). For example, the silicon II fluoride ($SiF_2$) may be formed by a reaction between the upper surface 317a of the second portion 315b of the sacrificial gate structure 315 and the remains of the first portion 315a of the sacrificial gate structure 315 and/or remains and byproducts of the chemical solution that is used in the stripping process.

The byproduct region 319a may prevent or otherwise hinder the second portion 315b of the sacrificial gate structure 315 from being removed by conventional processes.

For example, when a wet etching process is utilized to remove the second portion 315b of the sacrificial gate structure 315 the byproduct region 319a may prevent the etching solution used in the wet etching process from penetrating the second portion 315b of the sacrificial gate structure 315. Therefore, even after the wet etching process, the second portion 315b of the sacrificial gate structure 315 may not be adequately removed (sufficiently removed, substantially removed, or fully removed). This may be due to the presence of silicon II fluoride ($SiF_2$).

In this way, if the second portion 315b of the sacrificial gate structure 315 is not adequately removed, defects may occur in the finally generated semiconductor device. This may be referred to and understood as an un-strip problem.

For example, as the other part 315b of the sacrificial gate structure 315 remains, a size of an alternative gate electrode to be formed later may be formed to be different from an initial design value.

If the size of the alternate gate electrode changes, a threshold voltage of the gate may be changed differently than intended or expected. Therefore, defects may occur in some gates of the finally generated semiconductor device.

In some exemplary embodiments, an oxidation process may be utilized in order to address the un-strip issues as described above. For example, an oxidation process of oxidizing the byproduct region 319a formed on the upper surface 317a of the second portion 315b of the sacrificial gate structure 315 is performed.

Figure 10:
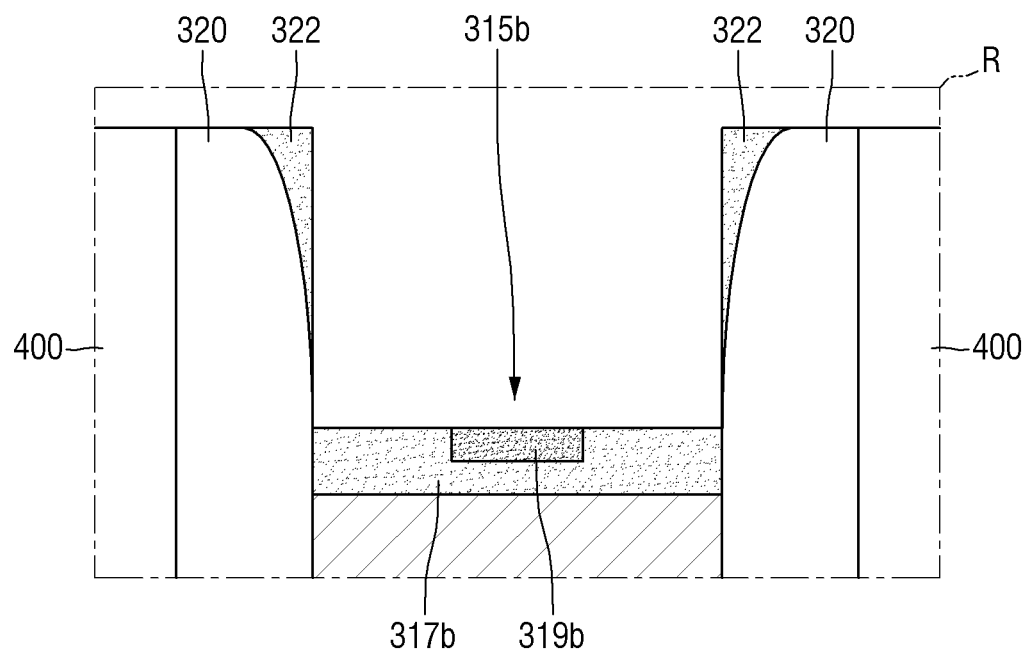

For reference, FIG. 10 is an enlarged view of the region R illustrated in FIG. 8. Referring to FIG. 10, an oxide film 317b is formed on the upper surface of the second portion 315b of the sacrificial gate structure 315 by an oxidation process. For example, the byproduct region 319a is oxidized by the oxidation process to form an oxidized byproduct region 319b.

For example, silicon II fluoride ($SiF_2$) that may be contained in the byproduct region 319a may be oxidized to form silicon oxide fluoride (SiOxF). Thus, after oxidation, the oxidized byproduct region 319b may include silicon oxide fluoride (SiOxF).

A spacer-oxide film 322 may be formed on the side surface of the gate spacer 320 as a byproduct of the oxidation process. For example, the spacer-oxide film 322 may be narrowed in width as it goes away from the upper part of the gate spacer 320 and towards the oxide film 317b.

In some embodiments of the present inventive concept, the oxidation process may be performed in-situ with the process of removing the first portion 315a of the sacrificial gate structure 315.

For example, the first portion 315a of the sacrificial gate structure 315 may be removed by a dry etching process and subsequently the oxidation process may be performed in the same reaction chamber as the dry etching process, without removing the substrate 100 from the reaction chamber.

In some embodiments of the present inventive concept, the oxidation process may be performed ex-situ with the process of removing the first portion 315a of the sacrificial gate structure 315.

For example, the first portion 315a of the sacrificial gate structure 315 may be removed by the dry etching process and subsequently the oxidation process may be performed in a reaction chamber that is different from the dry etching process. That is, after the dry etching process, the wafer may be moved to a new reaction chamber, and an oxidation process may be performed in the new reaction chamber.

In some embodiments of the present inventive concept, the oxide film 317b may be formed by an oxygen ($O_2$) ashing process (also referred to as an oxygen ($O_2$) etching process). For example, the oxygen ashing process may utilize plasma of oxygen ($O_2$), ozone ($O_3$), and/or nitrous oxide ($N_2O$) gas to oxidize the upper surface of the second portion 315b of the sacrificial gate structure 315.

In some embodiments of the present inventive concept, the oxygen etching process may be performed in-situ with the process of removing the first portion 315a of the sacrificial gate structure 315.

For example, the first portion 315a of the sacrificial gate structure 315 may be removed by the dry etching process and the oxygen etching process may be performed in the same reaction chamber as the dry etching process without removing the substrate 100 from the reaction chamber.

In some embodiments of the present inventive concept, the oxide film 317b may be formed by a cleaning process that utilizes a cleaning solution. For example, the cleaning solution may include and/or be: water, ammonia ($NH_4OH$), hydrogen peroxide ($H_2O_2$), and combinations thereof. For example, the cleaning solution may be a SC1 (Standard Cleaning 1) solution.

As the cleaning process is performed, the upper surface of the second portion 315b of the sacrificial gate structure 315 may be cleaned with the cleaning solution. At this time, the upper surface of the second portion 315b of the sacrificial gate structure 315 may be oxidized by the cleaning solution.

In other embodiments of the present inventive concept, the oxide film 317b may be formed by a chemical oxidation method, a UV oxidation method, a dual plasma oxidation method, or the like.

Figure 11:
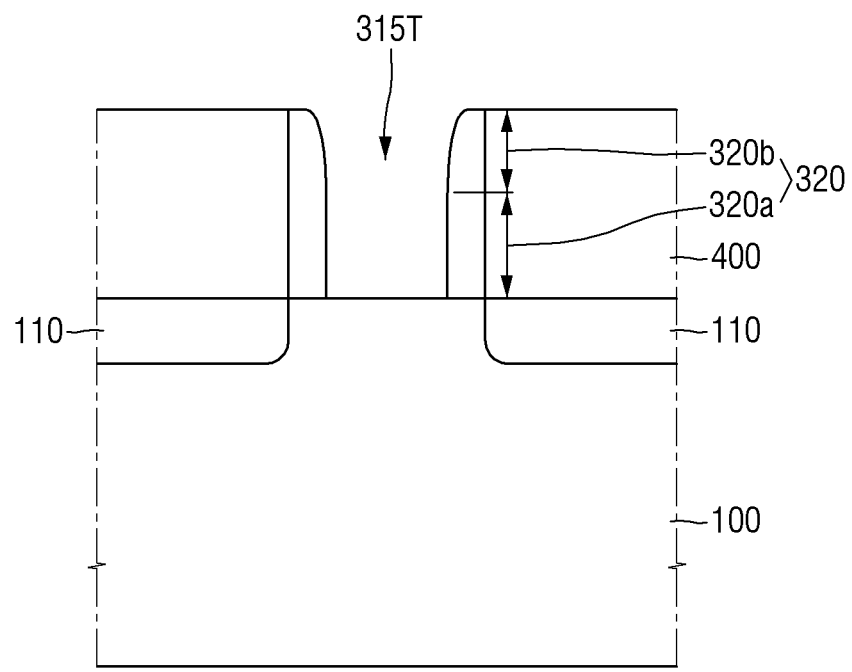

Referring to FIG. 11, the second portion 315b of the sacrificial gate structure 315 and the oxide film 317b (the remaining portion of sacrificial gate structure 315) are removed to form a gate trench 315T on the substrate 100. The gate trench 315T may expose a part of the upper surface of the substrate 100.

At this time, the spacer-oxide film 322 formed on the side surface of the gate spacer 320 (see FIG. 10) may be removed. Additionally, gate spacers 320 may include a first portion 320a (which has a constant width as it goes away from the upper surface of the substrate 100), and a second portion 320b (which has a width decreasing continuously as it goes away from the upper surface of the substrate 100).

In some embodiments of the present inventive concept, the second portion 315b of the sacrificial gate structure 315 and the oxide film 317b may be removed by the wet etching process. The oxide film 317b does not impede the penetration of the etching solution, unlike the byproduct region 319a.

Therefore, the etching solution can penetrate the second portion 315b of the sacrificial gate structure 315 and the oxide film 317b, and they may be removed by the etching solution.

In this case, the spacer-oxide film 322 formed on the side surface of the gate spacer 320 may also be removed by a wet etching process.

In some embodiments of the present inventive concept, the process of removing the second portion 315b of the sacrificial gate structure 315 and the oxide film 317b may be performed in-situ with the process of forming the oxide film 317b on the upper surface of the second portion 315b of the sacrificial gate structure 315.

For example, the oxide film 317b may be formed by an oxygen ($O_2$) ashing process. Alternatively, the second portion 315b of the sacrificial gate structure 315 and the oxide film 317b may be removed by a wet etching process. At this time, the cleaning process and/or the wet etching process may be performed in different reaction chambers. That is, after the oxidation process, the wafer may be moved to a new reaction chamber, and the wet etching process may be performed in the new reaction chamber.

In some embodiments of the present inventive concept, the process of removing the second portion 315b of the sacrificial gate structure 315 and the oxide film 317b may be performed in-situ with the process of forming the oxide film 317b on the upper surface of the second portion 315b of the sacrificial gate structure 315.

For example, the oxide film 317b may be formed by the cleaning solution used in the cleaning process. Alternatively, the second portion 315b of the sacrificial gate structure 315 and the oxide film 317b may be removed by a wet etching process. At this time, the cleaning process and/or the wet etching process may be performed in the same reaction chamber.

For example, the cleaning process and the wet etching process may be performed continuously, using a cleaning solution and an etching solution, respectively, which are sequentially provided into the reaction chamber.

Figure 12:
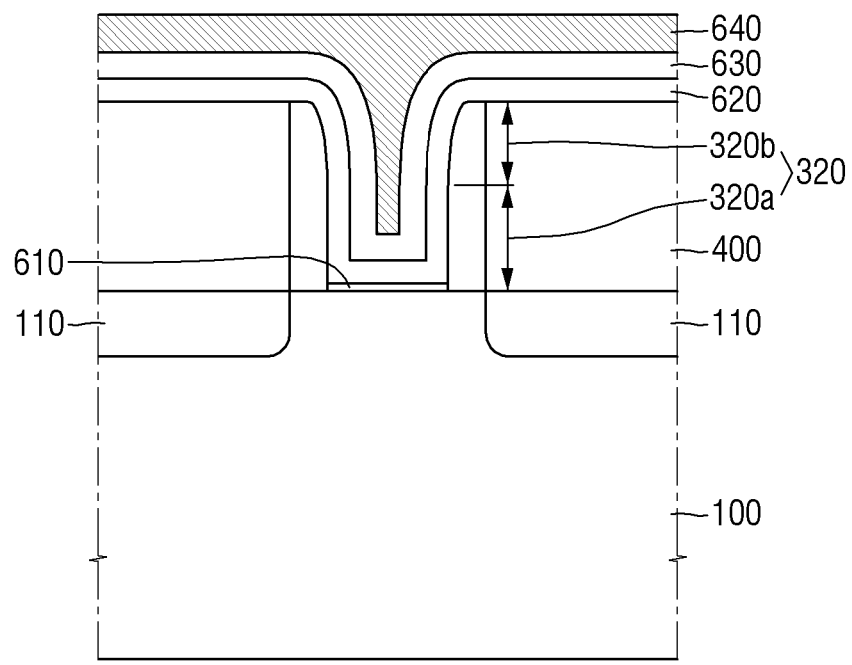

Referring to FIG. 12, an interface film 610, a dielectric film 620, a lower conductive film 630, and an upper conductive layer 640 are sequentially formed on the gate trench 315T.

As described above, the gate spacer 320 includes a second portion in which a width decreases continuously as it goes away from the upper surface of the substrate 100. Thus, the width of the gate trench 315T widens as it goes away from the upper surface of the substrate 100.

The structure of the gate trench 315T may prevent an occurrence of a void in the process of forming the dielectric film 620, the lower conductive film 630, and the upper conductive layer 640.

The interface film 610 may be formed on the bottom surface of the gate trench 315T. The interface film 610 may include a silicon oxide film.

For example, the interface film 610 may be formed, using a chemical oxidation method, a UV oxidation method, a dual plasma oxidation method, or the like.

The dielectric film 620 is formed on the interface film 610. The dielectric film 620 may be conformally formed along the upper surface of the interlayer insulating film 400, the upper surface of the gate spacer 320, and the side and bottom surfaces of the gate trench 315T.

For example, the dielectric film 620 may be formed, using a chemical vapor deposition (CVD), an atomic layer deposition (ALD) or the like.

The dielectric film 620 may include a high dielectric constant dielectric film, that may include and/or be (but is not limited to), for example: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The lower conductive film 630 is formed on the dielectric film 620. The lower conductive film 630 may be formed conformally along the upper surface of the interlayer insulating film 400, the upper surface of the gate spacer 320, and the side surface and the bottom surface of the gate trench 315T. That is, the lower conductive film 630 may be conformally formed along the dielectric film 620 and have a similar profile as dielectric film 620.

In FIG. 12, the lower conductive film 630 is formed to include one layer, but the present inventive concept is not limited thereto. For example, the lower conductive film 630 may include a plurality of layers.

The lower conductive film 630 may include an n-type work function adjustment film. As an example, the lower conductive film 630 may be a material selected from a group including TiAl, TiAlN, TaC or TiC. As another example, the lower conductive film 630 may be a TiAl film.

The lower conductive film 630 may include a p-type work function adjustment film. As an example, the lower conductive film 630 may include at least one of TiN or TaN. As another example, the lower conductive film 630 may include a TiN film or a TaN film. As still another example, the lower conductive film 630 may include a double film including a TaN film and a TiN film.

According to some embodiments of the present inventive concept, the lower conductive film 630 may include both an n-type work function adjustment film and a p-type work function adjustment film.

The upper conductive layer 640 is formed on the lower conductive film 630. The upper conductive layer 640 may be formed on top of and maintain a profile along the upper surface of the interlayer insulating film 400, the upper surface of the gate spacer 320, and the side surface and the bottom surface of the gate trench 315T. That is, the upper conductive layer 640 may be formed to fill the trench formed by the lower conductive film 630.

In FIG. 12, the upper conductive layer 640 is illustrated to include a single layer, but the present inventive concept is not limited thereto. For example, the upper conductive layer 640 may also include a plurality of layers.

For example, the upper conductive layer 640 may include and/or be at least one of: a structure in which a TiAl film, a TiN film and an Al film are sequentially stacked, a structure in which a TiN film, a TiAl film, a TiN film and an Al film are sequentially stacked, a structure in which a TiAl film, a TiN film, a Ti film and an Al film are sequentially stacked, and a structure in which a TiN film, a TiAl film, a TiN film, a Ti film and an Al film are sequentially stacked.

Alternatively, the upper conductive layer 640 may include and/or be, for example, one of: a structure in which a TiN film, a TiAlC film, a TiN film and a W film are sequentially stacked, or a structure in which a TiN film, a TiAl film, a TiN film and a W film are sequentially stacked.

Figure 13:
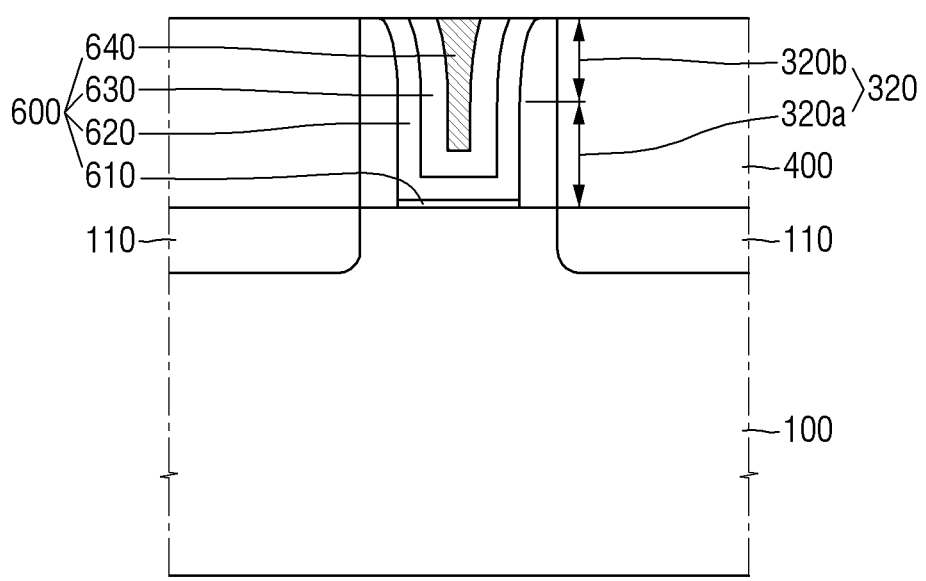

Referring to FIG. 13, the dielectric film 620, the lower conductive film 630, and the upper conductive layer 640 are planarized to form a gate electrode 600. The gate electrode 600 may include one part of the interface film 610 (a separated piece of the interface film 610), one part of the dielectric film 620 (a separated piece of the dielectric film 620), one part of the lower conductive film 630 (a separated piece of the lower conductive film 630), and one part of the upper conductive layer 640 (a separated piece of the upper conductive layer 640).

For example, the dielectric film 620, the lower conductive film 630, and the upper conductive layer 640 may be planarized by a planarization process such as a CMP process.

The planarization process of FIG. 13 may be performed until the upper surface of the interlayer insulating film 400, the upper surface of the gate spacer 320, and the upper surface of the gate electrode 600 are exposed.

For example, the gate spacer 320 may still include a first portion 320a which has a constant width as it goes away from the upper surface of the substrate 100, and a second portion 320b in which a width continuously decreases as it goes away from the upper surface of the substrate 100.

Hereinafter, a method for fabricating a semiconductor device according to some embodiments of the present inventive concept will be described with reference to FIGS. 1 to 6, 12, 13, and 14 to 19. For the convenience of description, the repeated contents of those described above will be omitted.

FIGS. 14 to 19 are intermediate stage diagrams illustrating a method for fabricating a semiconductor device according to some embodiments of the present inventive concept. An element isolation film such as a STI (shallow trench isolation) formed in a substrate is not illustrated in FIGS. 14 to 19 for ease of explanation and convenience of description.

Figure 14:
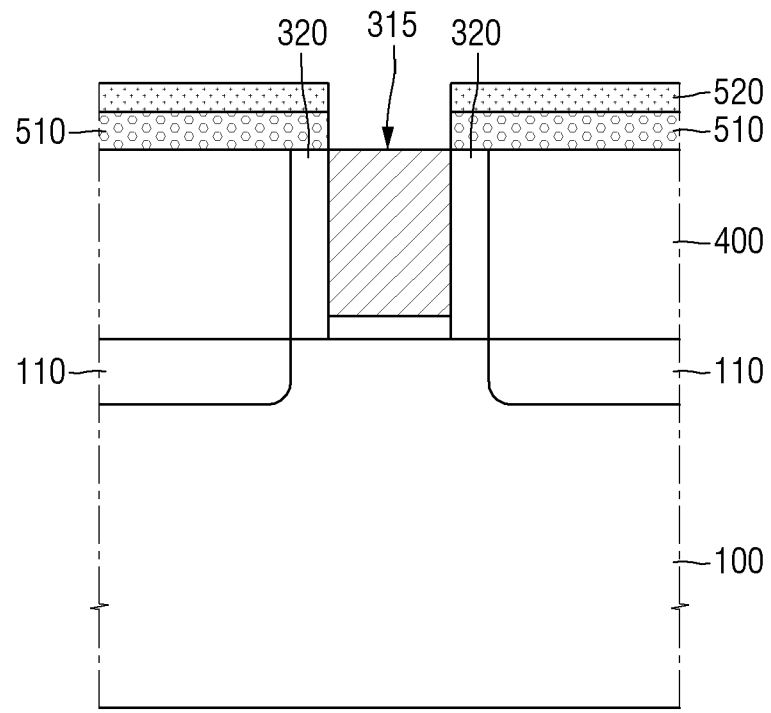
FIGS. 14 to 19 are intermediate stage diagrams illustrating a method for fabricating a semiconductor device according to some embodiments of the present inventive concept.

Referring to FIG. 14, a mask pattern 510 and a photosensitive film pattern 520 are formed on top of the interlayer insulating film 400 and the gate spacer 320. The mask pattern 510 and the photosensitive film pattern 520 may expose the sacrificial gate structure 315.

The mask pattern 510 may be formed by a photolithography process using the photosensitive film pattern 520. For example, after the mask layer and the photosensitive film pattern 520 are formed on the interlayer insulating film 400 and the gate spacer 320, a mask pattern may be formed by a photolithography process.

Figure 15:
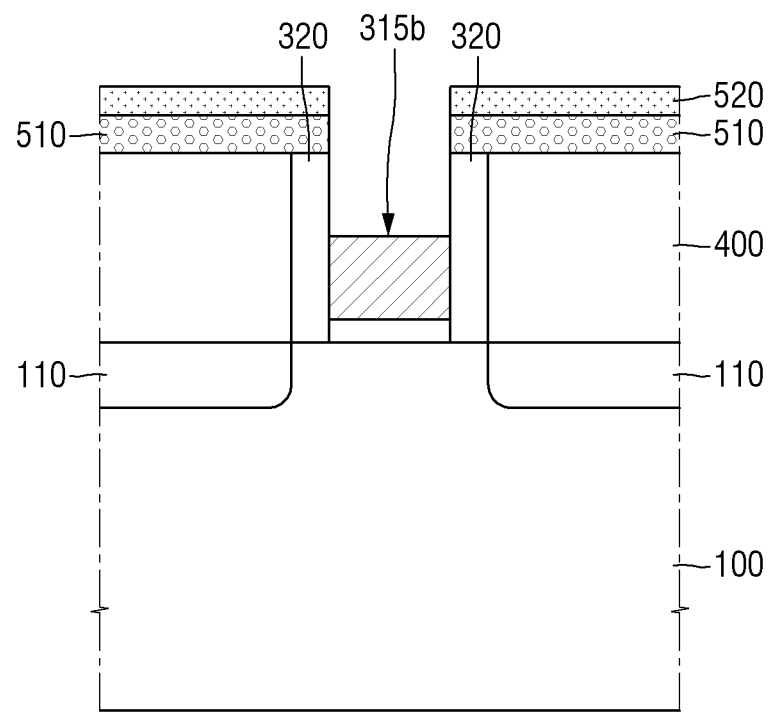

Referring to FIG. 15, first portion 315a of the sacrificial gate structure 315 is removed, using the mask pattern 510 and the photosensitive film pattern 520. The second portion 315b of the sacrificial gate structure 315 may remain on the substrate 100.

Figure 16:
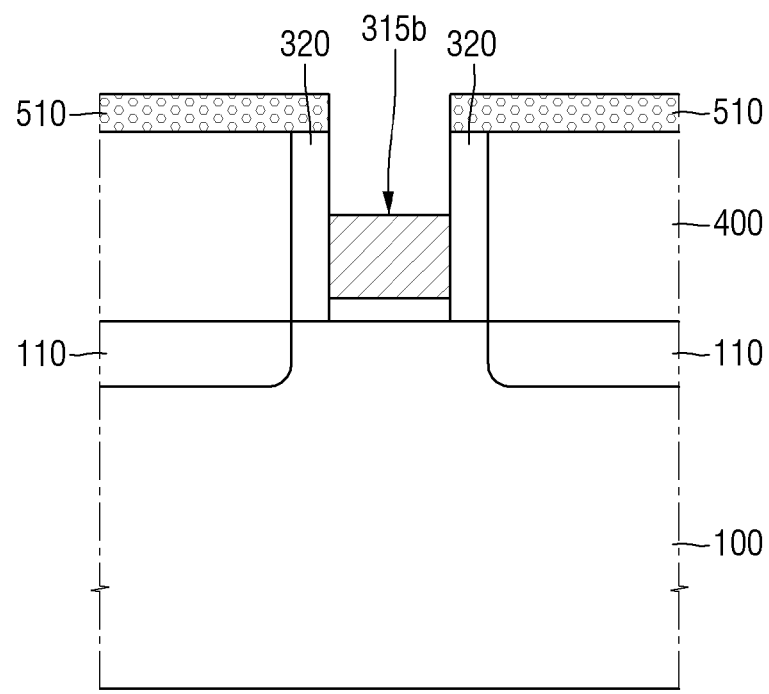

Referring to FIG. 16, the photosensitive film pattern 520 disposed on the mask pattern 510 is removed. The photosensitive film pattern 520 may be removed by a stripping process.

At this time, the mask pattern 510 may not be removed by the stripping process. The mask pattern 510 may be used in the process of removing the second portion 315b of the sacrificial gate structure 315.

Figure 17:
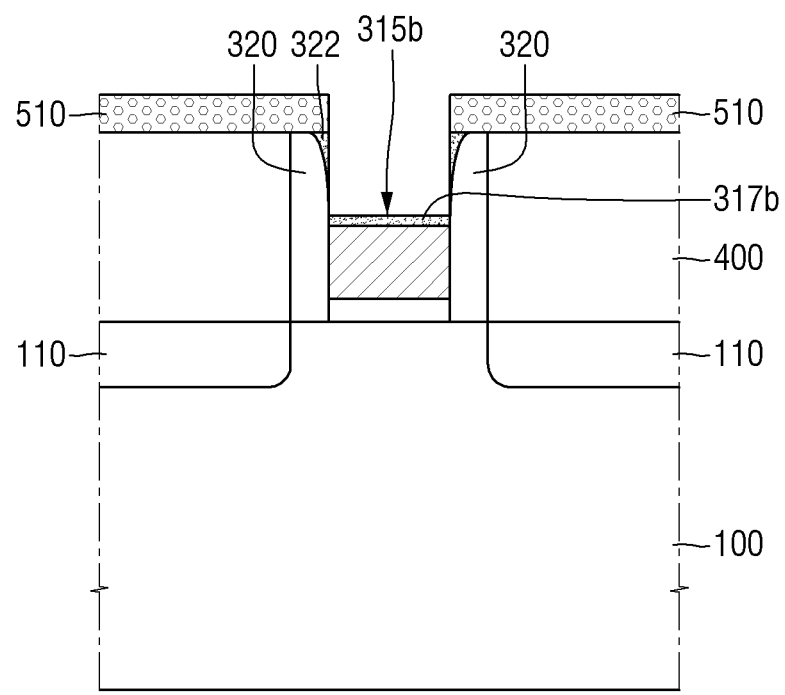

Referring to FIG. 17, an oxide film 317b is formed on the upper surface of the second portion 315b of the sacrificial gate structure 315. The oxide film 317b may be formed by an oxidation process.

A byproduct region 319a (see FIG. 9) formed on the upper surface of the sacrificial gate structure 315 may be oxidized by the oxidation process.

Figure 18:
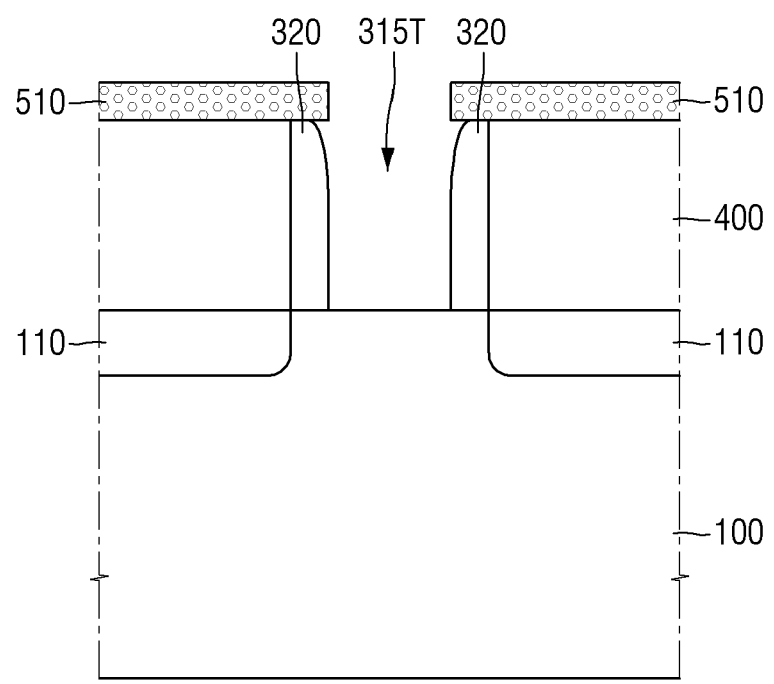

Referring to FIG. 18, the second portion 315b of the sacrificial gate structure 315 and the oxide film 317b are removed to form a gate trench 315T on the substrate 100. A part of the upper surface of the substrate 100 may be exposed by the gate trench 315T. At this time, a spacer-oxide film 322 formed on the side surface of the gate spacer 320 may be removed.

In some embodiments of the present inventive concept, the second portion 315b of the sacrificial gate structure 315 and the oxide film 317b may be removed by a wet etching process. For example, the wet etching process may provide an etching solution to the second portion 315b of the sacrificial gate structure 315 and the oxide film 317b, using a mask pattern 510.

Figure 19:
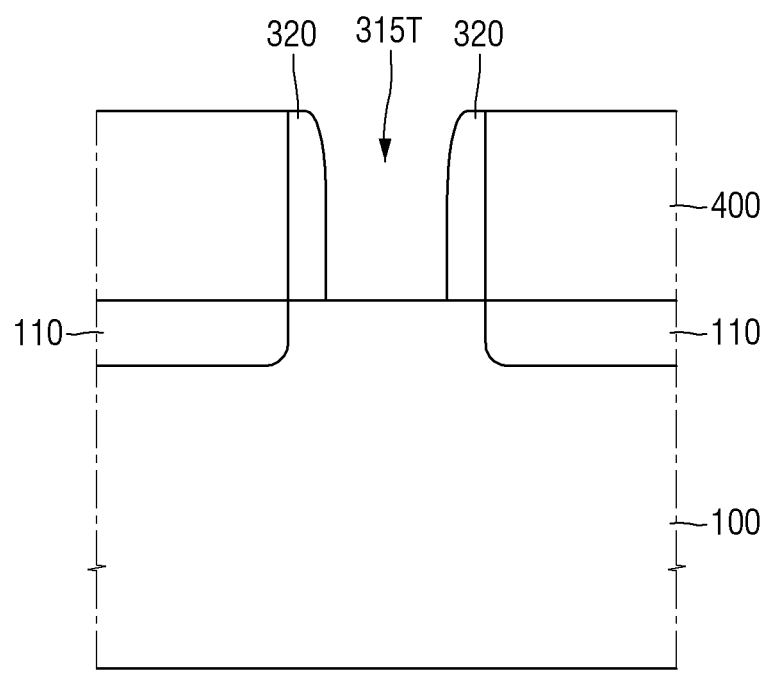

Referring to FIG. 19, the mask pattern 510 disposed on the interlayer insulating film 400 and the gate spacer 320 may be removed. The mask pattern 510 may be removed by a stripping process.

Referring to FIG. 12 again, an interface film 610, a dielectric film 620, a lower conductive film 630, and a metal gate electrode 600 (see FIG. 13) are sequentially formed on the gate trench 315T.

Referring to FIG. 13 again, the dielectric film 620, the lower conductive film 630, and the upper conductive layer 640 are planarized to form the gate electrode 600.

Hereinafter, a method for fabricating a semiconductor device according to some embodiments of the present inventive concept will be described with reference to FIGS. 1 to 12 and 20. For ease of explanation and convenience of description, the repeated contents of those described above will be omitted.

Figure 20:
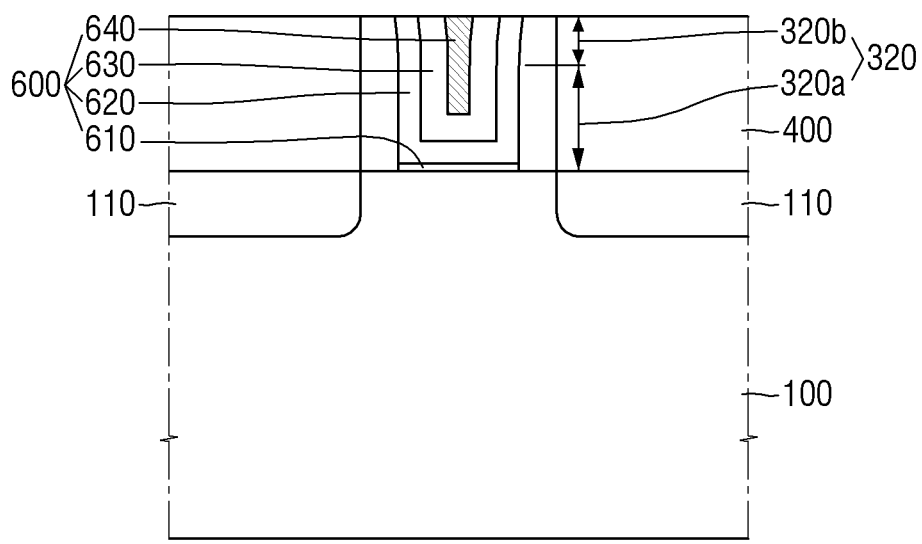
FIG. 20 is an intermediate stage diagram illustrating a method for fabricating a semiconductor device according to some embodiments of the present inventive concept.
Figure 21:
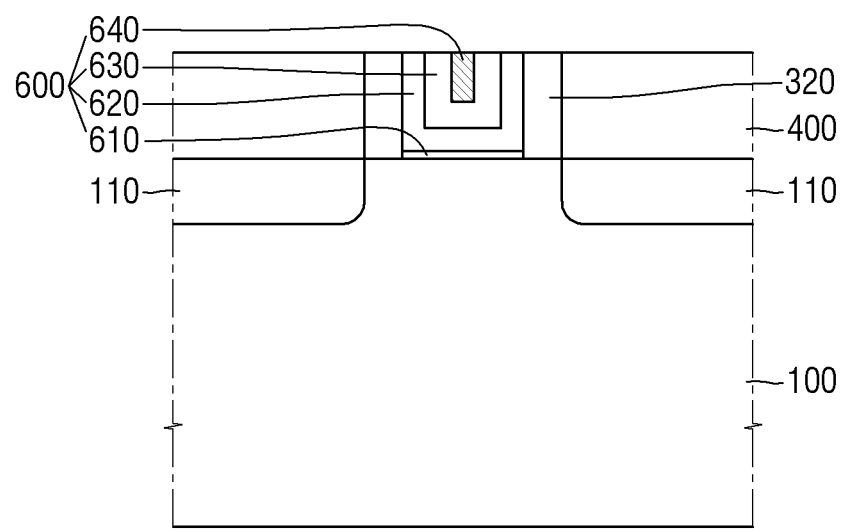
FIG. 21 is an intermediate stage diagram illustrating a method for fabricating a semiconductor device according to some embodiments of the present inventive concept.

FIG. 20 is an intermediate stage diagram illustrating the method for fabricating the semiconductor device according to some embodiments of the present inventive concept. In FIG. 21, an element isolation film such as a STI (shallow trench isolation) formed in the substrate is omitted for convenience of description.

Referring to FIG. 20, the dielectric film 620, the lower conductive film 630, and the upper conductive layer 640 are planarized to form the gate electrode 600.

A part of the interlayer insulating film 400, a part of the second portion 320b of the gate spacer 320, and a part of the gate electrode 600 may be removed by the planarization process. For example, a relatively small portion of: interlayer insulating film 400, second portion 320b of the gate spacer 320, and gate electrode 600 may be removed by the planarization process.

That is, the gate spacer 320 may still include a first portion 320a which has a constant width as it goes away from the upper surface of the substrate 100, and a second portion 320b in which a width continuously decreases as it goes away from the upper surface of the substrate 100.

Hereinafter, a method for fabricating a semiconductor device according to some embodiments of the present inventive concept will be described with reference to FIGS. 1 to 12 and 21. For ease of understanding and the convenience of description, the repeated contents of those described above will be omitted.

FIG. 21 is an intermediate stage diagram illustrating a method for fabricating the semiconductor device according to some embodiments of the present inventive concept. In FIG. 21, an element isolation film such as a STI (shallow trench isolation) formed in a substrate is omitted for convenience of description.

Referring to FIG. 21, the dielectric film 620, the lower conductive film 630, and the upper conductive layer 640 are planarized to form the gate electrode 600.

A part of the interlayer insulating film 400, a second portion 320b of the gate spacer 320, a part of the first portion 320a of the gate spacer 320, and a part of the gate electrode 600 may be removed by the planarization process. For example, an upper portion of interlayer insulating film 400, second portion 320b of the gate spacer 320, first portion 320a of the gate spacer 320, and gate electrode 600 may be removed by the planarization process to a predetermined level or depth. In an exemplary embodiment, an upper portion of interlayer insulating film 400, second portion 320b of the gate spacer 320, and gate electrode 600 are removed by the planarization process to a level that corresponds to an upper level of first portion 320a of the gate spacer 320. It shall be understood that a portion of first portion 320a of the gate spacer 320 may also be removed in accordance with the inventive concepts disclosed herein due to, e.g., convenience of manufacturing processes and tolerances.

The second portion 320b of the gate spacer 320, which decreases in width continuously as it goes from the upper surface of the substrate 100, may be completely removed by the planarization process.

At this time, the gate spacer 320 may include only the first portion 320a (or the majority of first portion 320a) which has a constant width as it goes away from the upper surface of the substrate 100.

In concluding the detailed description, those skilled in the art will appreciate that many variations and modifications may be made to the embodiments disclosed herein without substantially departing from the principles of the present inventive concept. Therefore, the disclosed embodiments of the inventive concept are used in a descriptive sense only and shall not be used for purposes of limitation.

It will be understood that, although the terms first and second may be used herein to describe various elements, components, regions, layers and/or sections, these elements, components, regions, layers and/or sections should not be limited by these terms. Unless the context indicates otherwise, ordinal terms are only used to distinguish one element, component, region, layer or section from another element, component, region, layer or section, for example as a naming convention. In addition, in certain cases, even if a term is not described using "first," "second," etc., in the specification, it may still be referred to as "first" or "second" in a claim in order to distinguish different claimed elements from each other.

What is claimed is:

1. A method for fabricating a semiconductor device, the method comprising:
   forming a sacrificial gate structure on a substrate, the sacrificial gate structure including a first portion of a sacrificial gate electrode, a second portion of a sacrificial gate electrode, and a sacrificial dielectric film pattern;
   removing the first portion of the sacrificial gate electrode to expose an upper surface of the second portion of the sacrificial gate electrode, wherein a lower surface of the second portion of the sacrificial gate electrode contacts the sacrificial dielectric film pattern;
   forming an oxide film by oxidizing the upper surface of the second portion of the sacrificial gate electrode after removing the first portion of the sacrificial gate electrode;
   forming a trench on the substrate by removing the oxide film, the second portion of the sacrificial gate electrode, and the sacrificial dielectric film pattern; and
   forming a gate electrode that fills the trench.

2. The method for fabricating the semiconductor device of claim 1, wherein the sacrificial gate structure comprises polysilicon (poly Si).

3. The method for fabricating the semiconductor device of claim 1, wherein a dry etching process is utilized to remove the first portion of the sacrificial gate electrode.

4. The method for fabricating the semiconductor device of claim 1, wherein a wet etching process is utilized to remove the oxide film and the second portion of the sacrificial gate electrode.

5. The method for fabricating the semiconductor device of claim 1, wherein the formation of the oxide film is performed in-situ with the removal of the first portion of the sacrificial gate electrode.

6. The method for fabricating the semiconductor device of claim 1, wherein the formation of the oxide film is performed ex-situ with: the removal of the first portion of the sacrificial gate electrode and the removal of the oxide film and the second portion of the sacrificial gate electrode.

7. The method for fabricating the semiconductor device of claim 1, wherein the formation of the oxide film utilizes at least one chosen from: plasma of oxygen (O2), ozone (O3), and nitrous oxide (N2O) gas.

8. The method for fabricating the semiconductor device of claim 1, wherein the formation of the oxide film is performed in-situ with the removal of the oxide film and the second portion of the sacrificial gate electrode.

9. The method for fabricating the semiconductor device of claim 1, wherein the oxide film is formed by cleaning an upper surface of the second portion of the sacrificial gate electrode with a cleaning solution.

10. The method for fabricating the semiconductor device of claim 9, wherein the cleaning solution contains ammonia (NH$_4$OH) and hydrogen peroxide (H$_2$O$_2$).

11. A method for fabricating a semiconductor device, the method comprising:
    forming a sacrificial gate structure on a substrate, the sacrificial gate structure including a first portion of a sacrificial gate electrode, a second portion of a sacrificial gate electrode, and a sacrificial dielectric film pattern;
    forming gate spacers on both sides of the sacrificial gate structure;
    forming an etching mask pattern for exposing an upper surface of the sacrificial gate structure and an upper surface of the gate spacers;
    removing the first portion of the sacrificial gate electrode by a first etching process that utilizes the etching mask pattern to expose an upper surface of the second portion of the sacrificial gate electrode, wherein a lower surface of the second portion of the sacrificial gate electrode contacts the sacrificial dielectric film pattern;
    removing the etching mask pattern by a stripping process;
    forming an oxide film by oxidizing the upper surface of the second portion of the sacrificial gate electrode by utilizing an oxidation process;
    forming a trench by removing the oxide film, the second portion of the sacrificial gate electrode, and the sacrificial dielectric film pattern by a second etching process; and
    forming an alternative gate electrode that fills the trench.

12. The method for fabricating the semiconductor device of claim 11, wherein the first etching process is a dry etching process, and
    wherein the second etching process is a wet etching process.

13. The method for fabricating the semiconductor device of claim 11, wherein the oxidation process utilizes at least one chosen from: plasma of oxygen (O2), ozone (O3), and nitrous oxide (N2O) gas.

14. The method for fabricating the semiconductor device of claim 11, further comprising:
    cleaning the upper surface of the second portion of the sacrificial gate electrode by utilizing a wet cleaning process that is performed after the stripping process,
    wherein the oxidation process utilizes a cleaning solution that is used in the wet cleaning process.

\* \* \* \* \*